United States Patent
Wu

(10) Patent No.: US 7,491,633 B2
(45) Date of Patent: Feb. 17, 2009

(54) HIGH SWITCHING SPEED TWO MASK SCHOTTKY DIODE WITH HIGH FIELD BREAKDOWN

(75) Inventor: Shye-Lin Wu, No. 10, Alley 53, Lane 454, Chen Kung Road, Hu Kuo Hsiang, Hsinchu Hsien (TW)

(73) Assignees: Chip Integration Tech. Co., Ltd., Chu-pei (TW); Shye-Lin Wu, Hsinch Hsien (TW)

( * ) Notice: Subject to any disclaimer, the term of this patent is extended or adjusted under 35 U.S.C. 154(b) by 420 days.

(21) Appl. No.: 11/453,933

(22) Filed: Jun. 16, 2006

(65) Prior Publication Data

US 2007/0290234 A1     Dec. 20, 2007

(51) Int. Cl.
*H01L 21/28*     (2006.01)
*H01L 21/44*     (2006.01)

(52) U.S. Cl. .................. 438/582; 438/237; 438/589; 257/330

(58) Field of Classification Search .......... 438/237, 438/259, 582, 589; 257/329, 330
See application file for complete search history.

(56) References Cited

U.S. PATENT DOCUMENTS

| | | | |
|---|---|---|---|
| 7,064,408 B2* | 6/2006 | Wu | 257/484 |
| 7,078,780 B2* | 7/2006 | Wu | 257/471 |
| 7,323,402 B2* | 1/2008 | Chiola | 438/576 |
| 2005/0230744 A1* | 10/2005 | Wu | 257/330 |
| 2008/0087896 A1* | 4/2008 | Chiola | 257/73 |

* cited by examiner

*Primary Examiner*—Fernando L Toledo
(74) *Attorney, Agent, or Firm*—Birch, Stewart, Kolasch & Birch, LLP

(57) ABSTRACT

A power Schottky rectifier device and method of making the same are disclosed. The Schottky rectifier device includes a LOCOS structure grown on the bottom of the trenches by using nitride spacer on the sidewall of the trenches as a thermal oxidation mask. A polycrystalline silicon layer is then filled the first trenches. Under LOCOS structure, a p doped region is optionally formed to minimize the current leakage when the device undergoes a reverse biased. A Schottky barrier silicide layer formed by sputtering and annealing steps is formed on the upper surfaces of the epi-layer and the polycrystalline silicon layer. A top metal layer served as anode is then formed on the Schottky barrier silicide layer and extended to cover a portion of field oxide region of the termination trench. A metal layer served as a cathode electrode is then formed on the backside surface of the substrate opposite to the top metal layer.

10 Claims, 7 Drawing Sheets

HIGH SWITCHING SPEED TWO MASK SCHOTTKY DIODE WITH HIGH FIELD BREAKDOWN

FIELD OF THE INVENTION

The present invention relates to a semiconductor process, specifically, to a novel termination structure for trench MOS devices so as to prevent leakage current.

BACKGROUND OF THE INVENTION

Schottky diode is an important power device and used extensively as output rectifiers in switching-mode power supplies and in other high-speed power switching applications, such as motor drives, switching of communication device, industry automation and electronic automation and so on. The power devices are usually required characteristics of carrying large forward current, high reverse-biased blocking voltage, such as above 100 volt, and minimizing the reverse-biased leakage current.

A number of power rectifiers have been used to provide high current and reverse blocking characteristics. Hsu et al disclosed a Schottky rectifier structure in IEEE ELECTRON DEVICE LETTERS, vol. 22, No. 11, p. 531 (2001); "A Novel Trench Termination Design For 100 V TMBS diode Application." As is shown in FIG. 1A, the structure includes a plurality of trench type MOS gates 30 and a termination trench 25 formed into n– epi layer 20, which is formed on an n+ substrate 10. The termination trench 25 has spacer like MOS gates 35 formed on the sidewall of the termination trench 25. A patterned insulating layer such as TEOS 40 is then formed on the termination trench 25. The spacer like MOS gates 35 are almost covered by the TEOS layer 40 except a contact 36, which is adjacent to the active region. A patterned metal layer 50 acts as the anode electrode is then formed on the active region to contact the trench type MOS gates 30 and mesas 31 and the contact 36 of the spacer like MOS gate 35.

The Schottky rectifier structure of Hsu disclosed is designed for high voltage and is capable of achieving a reverse blocking voltage over 100 V at an extreme low-leakage current. However, the processes require at least three photo masks: one is for trenches defined, the second is for TEOS defined and the third is for metal extension in the termination region. Thus, an object of the present method is to simplify the processes. According to the present invention, only two photo masks are used.

Another conventional method is disclosed by Chang in U.S. Pat. No. 6,252,288. The structure shown in FIG. 1B includes a plurality of trenches 60 recessed into n– epi layer 52 that is formed on the n+substrate 54. Each of the trenches 60 is formed with an oxide liner 64 on the sidewall and a p+ doping region 66 at the bottom of the trenches 60. The trenches 60 are then refilled with a polysilicon layer 62. A Schottky barrier metal layer 56 served as an anode is then formed and patterned on the resulted surface of the substrate. Finally, another metal layer 158 served as cathode is formed on the backside surface of the substrate opposite to the anode. The area from the midpoint of one trench structure to the midpoint of an adjacent trench structure is referred to as a "cell".

Chang does not disclose fabricating method of about the forgoing devices. Apart from that, no termination structure is include, and the capability of about prohibiting premature breakdown is doubtful when the device is under reversed biased high voltage since the structure contains only thin oxide liner 64.

An object of the present invention is to propose a high switching speed two mask Schottky diode with high field breakdown and a method of making the same.

SUMMARY OF THE INVENTION

The present invention discloses a power Schottky rectifier device and its fabrication method. The method comprises the following steps: First, an n+ semiconductor substrate having an epi-layer doped with n– impurities formed thereon is provided. Then a first oxide layer, a first nitride layer, and a second oxide layer (ONO) are sequentially formed on the epi-layer. A photoresist pattern is formed on the second oxide layer to define first trenches and termination trench. After patterning, the hard mask (ONO), the photoresist pattern is removed. An etching step is then followed to recess the epi-layer by using the hard mask as an etch mask. Subsequently, a thermal oxide liner is grown on the sidewalls of the trenches. A thin nitride spacer forming step is then followed. Thereafter, an oxidation process to form LOCOS on the bottom of the trenches using the silicon nitride spacer as a mask. A polycrystalline silicon layer is then formed and etch-backed. As a result, the first trenches are refilled with a polycrystalline silicon layer. In the meanwhile, the sidewall of the termination trench is formed with a conductive spacer made of the polycrystalline silicon. A Schottky barrier metal layer is then formed on the front surface by sputtering. Afterward, an anneal process is followed to form a silicide layer so as to reduce the resistance thereof. A top metal layer is then formed on the silicide layer and on the LOCOS of the termination trench. The top metal layer is then patterned to define anode and hence the top metal layer is formed on the silicide layer from the active region to cover only an extension portion of the LOCOS of the termination trench. Finally, a cathode layer is formed on the backside surface of the substrate opposite to the top metal layer.

The present invention also provides two modified methods based on the first preferred embodiment. In the second preferred embodiment, the power rectifier includes an extra n doping region formed beneath the silicide layer. In the third preferred embodiment, the power rectifier includes the p doping region formed beneath the LOCOS layer to further minimize the current leakage and enhance the reverse breakdown voltage.

The forgoing processes only require two masks: one for defining the trenches and the other is to pattern the top metal layer. Hence, the method in accordance with the present invention is much simpler than any conventional method known by the author's knowledge. They require at least three photo masks.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
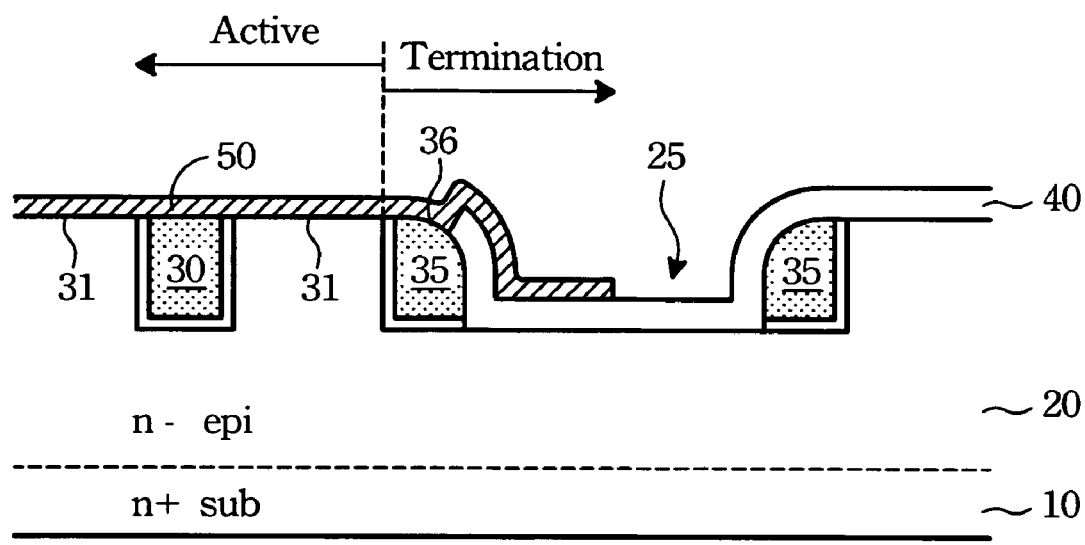
FIG. 1A and FIG. 1B shows the conventional trench Schottky diode devices with a trench termination structure.
Figure 1B:
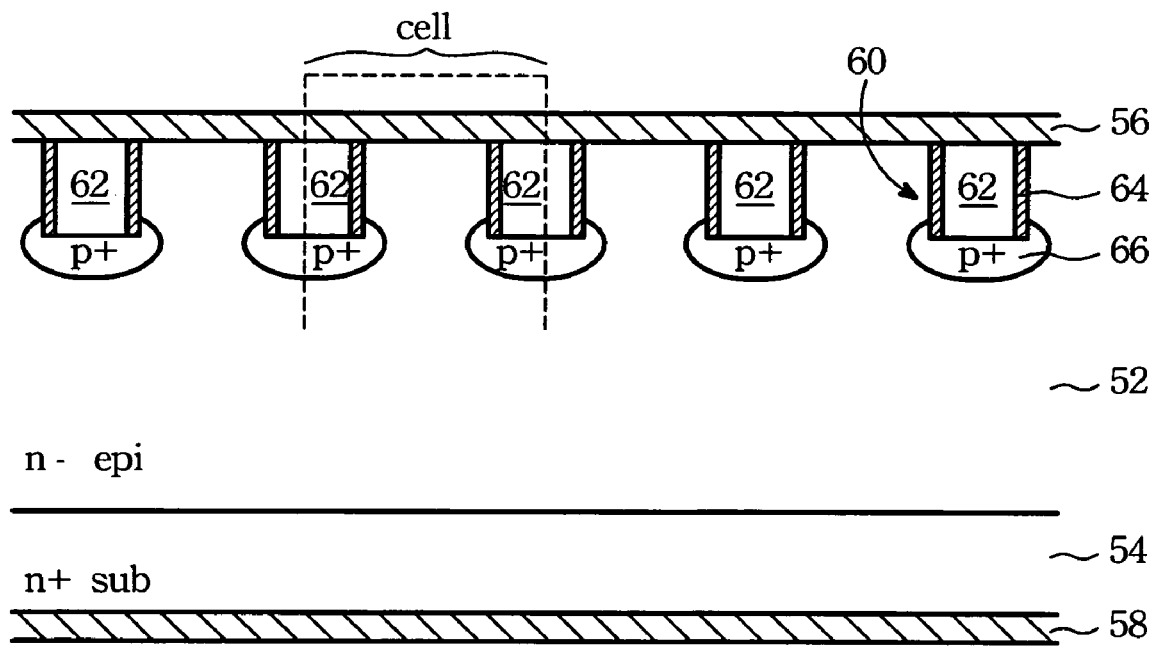
Figure 2:
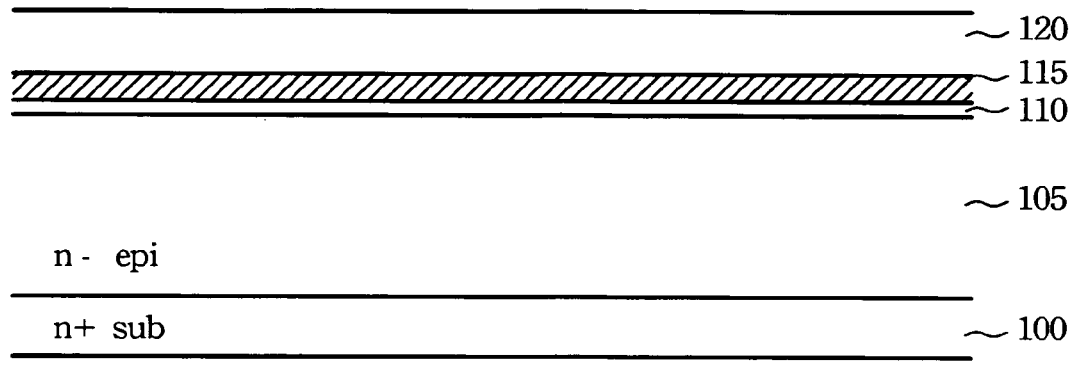
FIG. 2 is a cross-sectional view of forming an oxide layer on an n– epi-layer and an n layer beneath the n– epi-layer of an n+ semiconductor substrate in accordance with the present invention.

As depicted in the forgoing background of the invention, the conventional techniques requires at least three photo masks to form a power rectifier device and its termination structure. The present invention can simplify the processes and reduce the photo mask requirement to two. In addition, the structure of the invention proposed contains LOCOS at the bottom of the trenches, and hence, the structure is capable of tolerating high reverse biased voltage. The detailed descriptions are as follows:

Referring to FIG. 2, a cross-sectional view shows an n+ doped semiconductor substrate 100 thereof formed successively with an n– epi-layer 105, a first oxide layer 110, a first nitride layer (Nit1) 115, and a second oxide layer 120. The first oxide layer 110 is formed of about 5-200 nm by a thermal oxidation or by a chemical vapor deposition (CVD). The nitride layer 115, and the second oxide layer 120 are formed by CVD to about 50-500 nm and 40-1000 nm, respectively, in thickness.

Figure 3:
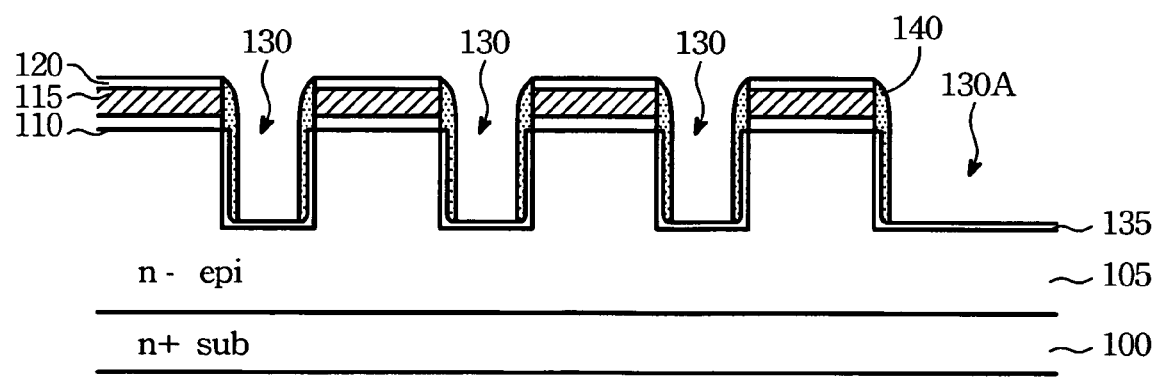
FIG. 3 is a cross-sectional view of forming hard mask pattern layer on the oxide layer and forming a dual implant region into n–epi layer in accordance with the present invention.

Referring to FIG. 3, to define an active region, a photoresist pattern (not shown) is then formed on the second oxide layer 120. Next, a hard mask formed of the second oxide layer 120/the nitride layer 115/the first nitride layer 110 is patterned by an etching step using the photoresist pattern as a mask.

After a removal of the photoresist layer, another etching process to recess the substrate is performed to form first trenches 130 and second trench (hereinafter called termination trench) 130A, which have a depth of about 0.5-10 µm. A thermal oxidation to grow a third oxide layer 135 of about 2-200 nm on the bottoms and the sidewalls except surfaces of the dielectric layers (110, 115 and 120) of the trenches 130, 130A is then performed. Next, a second thin nitride layer (Nit2) 140 of about 5-100 nm in thickness is then deposited. An anisotropic etch-back process is then carried out to form thin Nit2 spacers 140 on the trench sidewalls.

Figure 4:
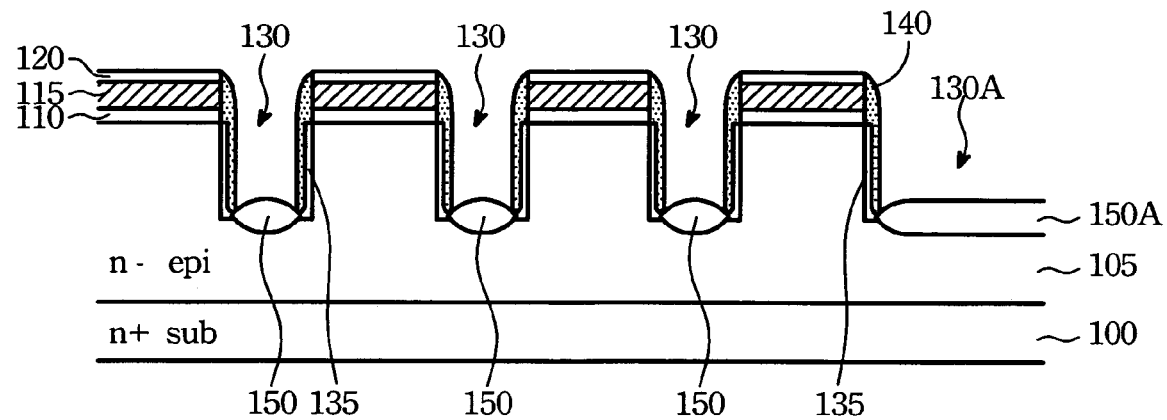
FIG. 4 is a cross-sectional view of performing thermal oxidation to form LOCOS structure in accordance with the present invention.

Still referring to FIG. 4, a thermal oxidation is then followed to grow a thick field oxide layer 150, 150A by consuming the silicon layer inside the trench bottom. The thick field oxide layer 150, 150A has a thickness of about 0.2 µm-2 µm.

Figure 5:
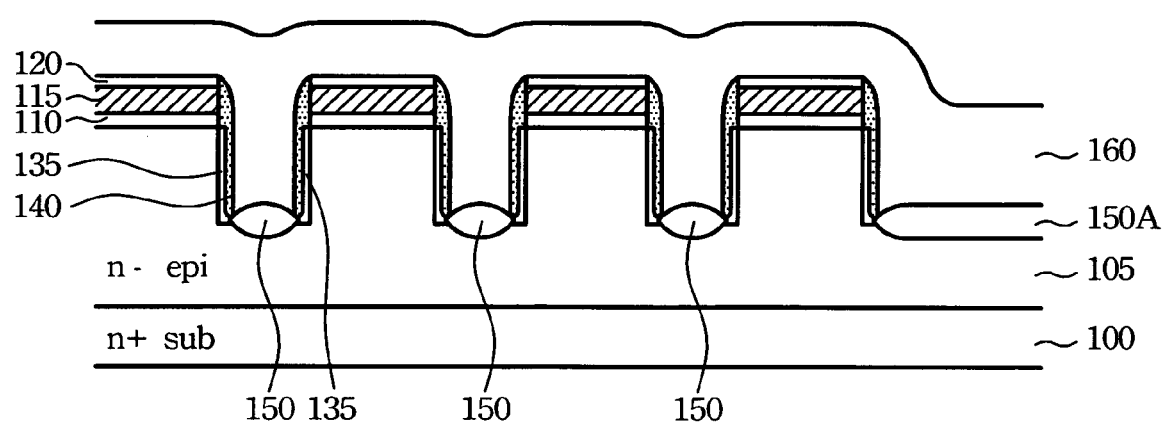
FIG. 5 is a cross-sectional view of forming polycrystalline silicon layer on all areas.
Figure 6:
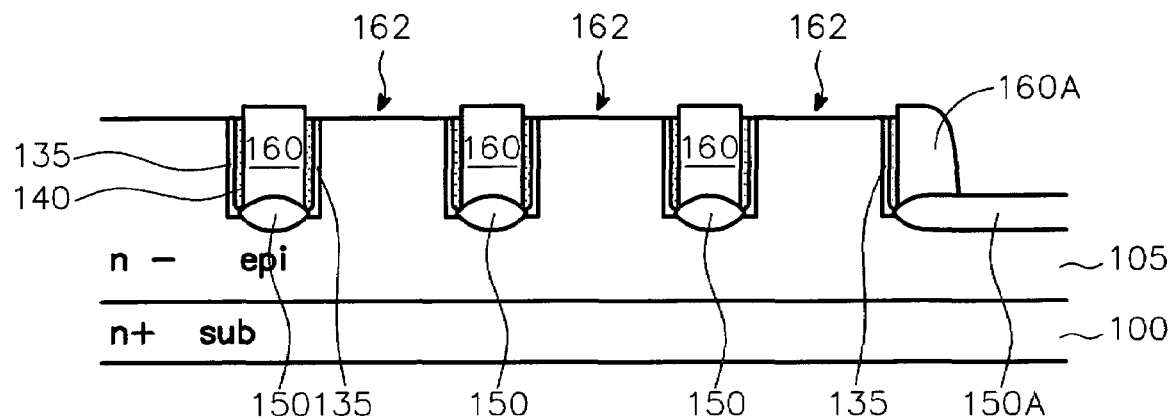
FIG. 6 is a cross-sectional view of performing an etch back step to remove excess polycrystalline silicon layer over the epi-layer in accordance with the present invention.

Referring to FIG. 5, a polycrystalline silicon layer 160 deposited on entire surfaces and filled the trenches 130 and 130A is then conducted. The polycrystalline silicon layer 160 can be either an n– impurity doped or p+ doped or even undoped silicon layer. Subsequently, an anisotropic etching process is then performed to remove the excess polycrystalline silicon layer 160 by using the second oxide layer 120 and/or the nitrogen layer 115 as an etch stop layer. A spacer-like polygate 160A formed on the sidewall of the termination trench 130A is resulted. Thereafter, the second oxide layer 120 and the nitrogen layer 115, and first oxide layer 110 are then removed sequentially. The results are shown in FIG. 6.

Figure 7:
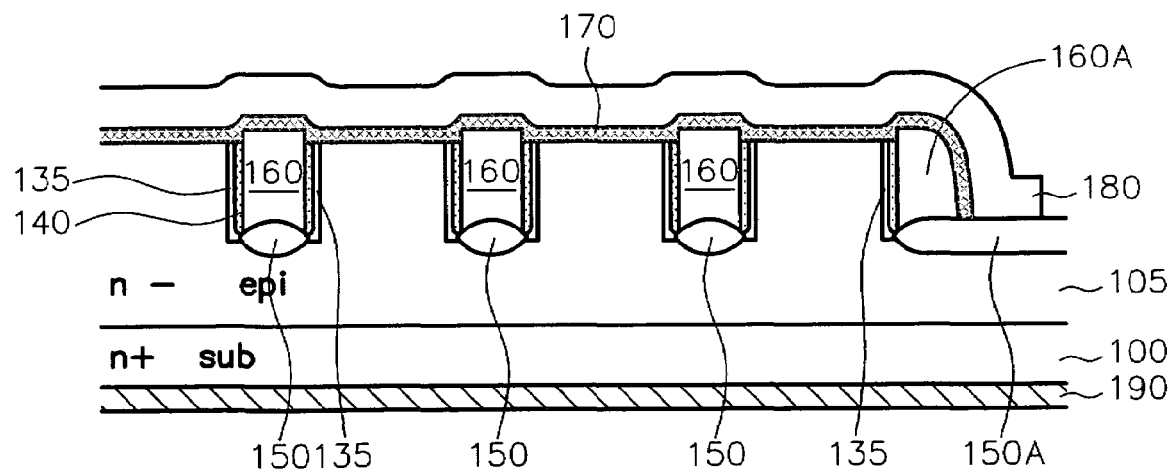
FIG. 7 is a cross-sectional view of Schottky power rectifier structure with a Schottky barrier silicide layer and a top metal on the front surface and a metal layer on the rear surface in accordance with the present invention.

Referring to FIG. 7, a barrier metal layer 165 deposited by sputtering on the front surfaces of the n epi-layer 105 is performed, as shown. The material of the barrier metal layer, for instance, Ti, Ni, Cr, Mo, Pt, Zr, W etc., can be served as candidates. A thermal anneal is then done to form metal silicide 170 layer in nitrogen ambient. Worthwhile, the silicide layer 170 is extended to cover all areas of the active region except the exposed portion of the field oxide region 150A of the termination trench 130A. In the active region, since both the nitride spacer 140 and the oxide spacer 135 are thin, the upper surface of them is found to be formed with the silicide layer 170 due to the bridge effect. The un-reacted metal layer on the termination field oxide region 150A is then removed. Afterward, a top metal layer 180 is deposited on the entire surfaces. The material of the top metal layer 180 is chosen from a TiNiAg layer or a TiW/Al layer or a Al layer. Subsequently, a backside layer grinding is performed to remove all of the layers formed on the backside surface of the substrate 100 during aforementioned processes and then a metal layer 190 function as a cathode is formed on the grinded surface.

Figure 8:
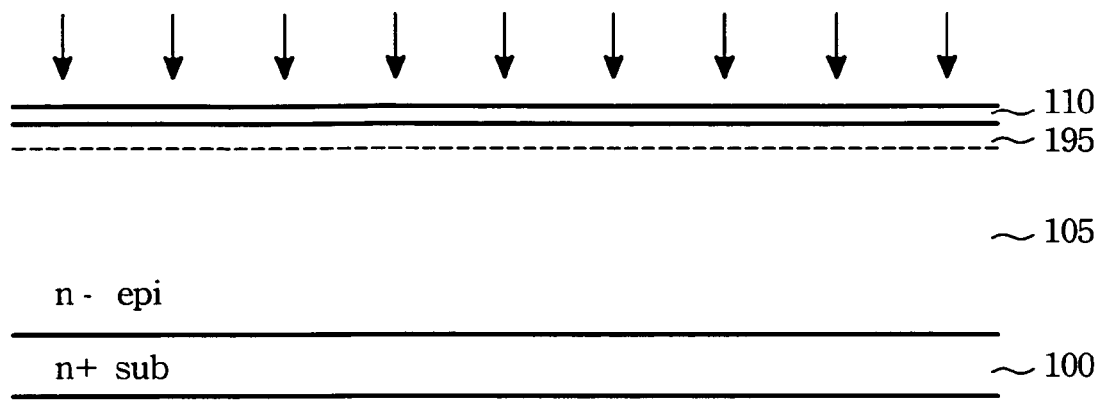
FIG. 8 is a cross-sectional view of forming an n doped region beneath the first oxide layer in accordance with the second preferred embodiment of the present invention.
Figure 9:
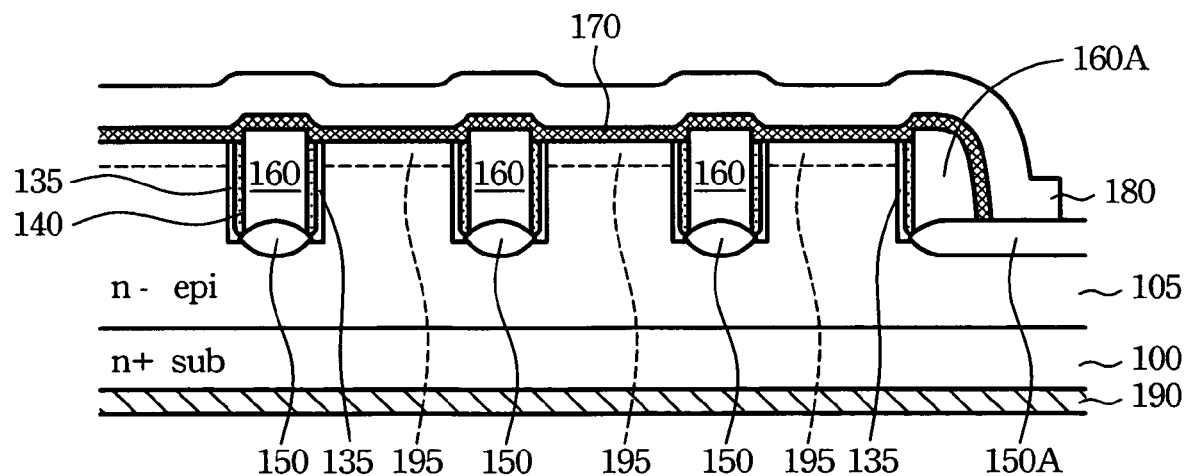
FIG. 9 is a cross-sectional view of Schottky power rectifier structure with an n doped region beneath silicide layer to reduce the resistance in accordance with the second preferred embodiment of the present invention.

The forging description is presented to enable one of ordinary skill in the art to make and use the invention and is provided in the context of a patent application and its requirement. The preferred embodiment is not intended to be limited to the embodiment shown but is to be accorded the widest scope consistent with the principles and features described herein. For example, as is shown in FIG. 8 and FIG. 9, the second preferred embodiment, shows an example of the modification. FIG. 9 shows a cross-sectional view of the resultant structure. It shows an extra n doped layer 195 beneath the metal silicide layer 170 comparing with the first preferred embodiment. The n doped layer 195 can be doped before forming first nitride layer, please see FIG. 8.

Figure 10:
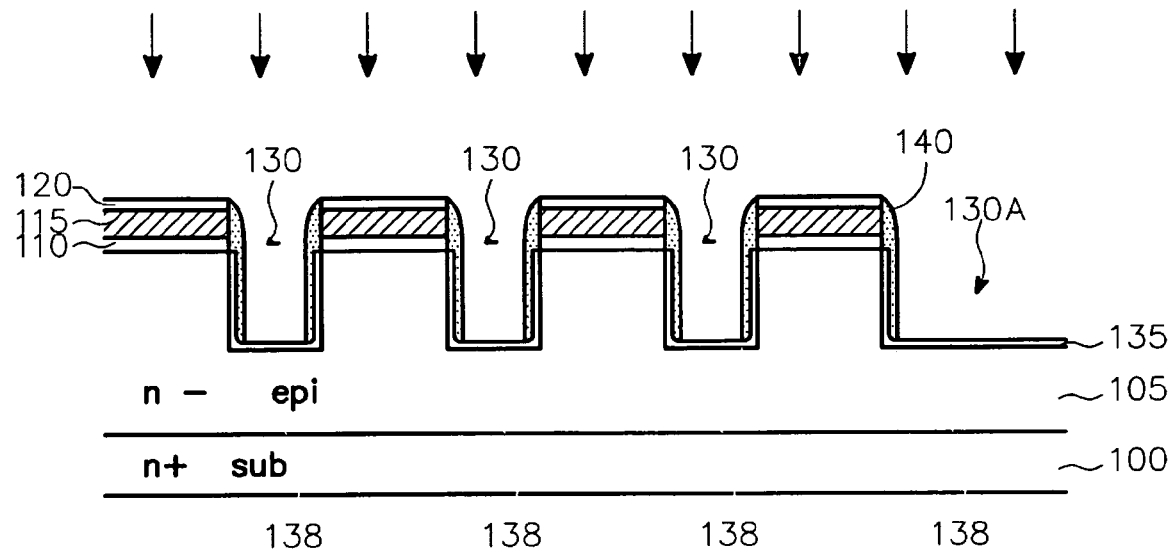
FIG. 10 is a cross-sectional view of forming a p doped region beneath the LOCOS in accordance with the third preferred embodiment of the present invention.
Figure 11:
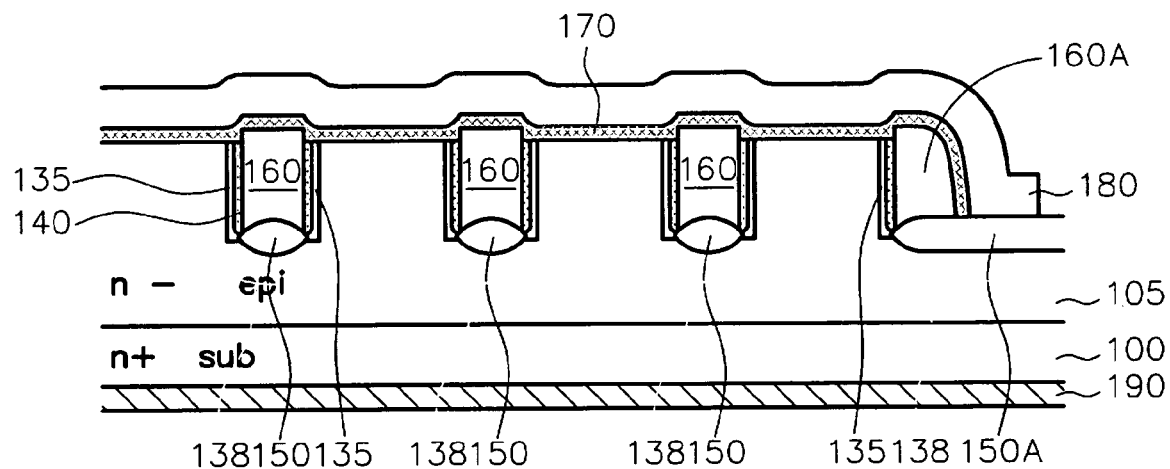
FIG. 11 is a cross-sectional view of Schottky power rectifier structure with a p doped region beneath the LOCOS in accordance with the third preferred embodiment of the present invention.

The third preferred embodiment is shown in FIG. 10, and FIG. 11. FIG. 10 shows a p type doping region 138 is formed beneath the trench bottom by an ion implant before performing oxidation process to form field oxide region 150. The remnant fabricating steps are the same as those mentioned in the first preferred embodiment. FIG. 11 shows a resultant structure, which shows a p region 138 formed beneath each field oxide region 135 that will further minimizing the current leakage and enhance the breakdown voltage when the device undergoes a reverse biased.

Figure 12A:
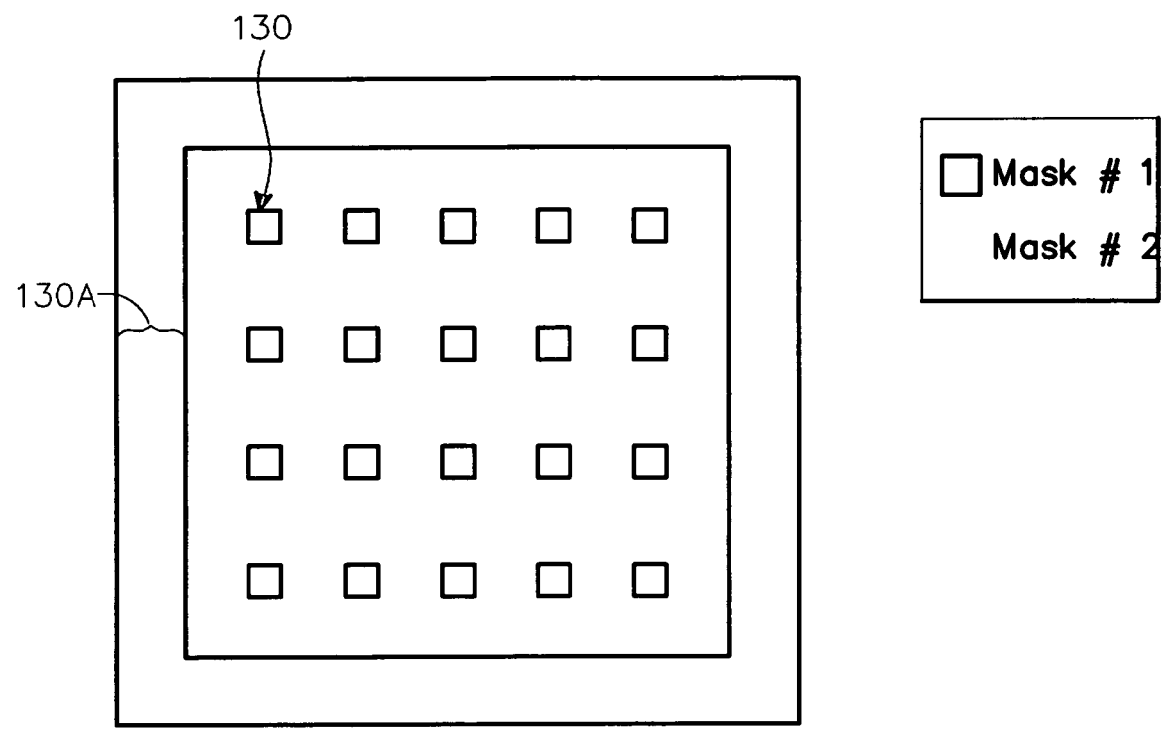
FIGS. 12A and 12B are synoptic layouts to show the cells and the termination region; only two masks are demanded.
Figure 12B:
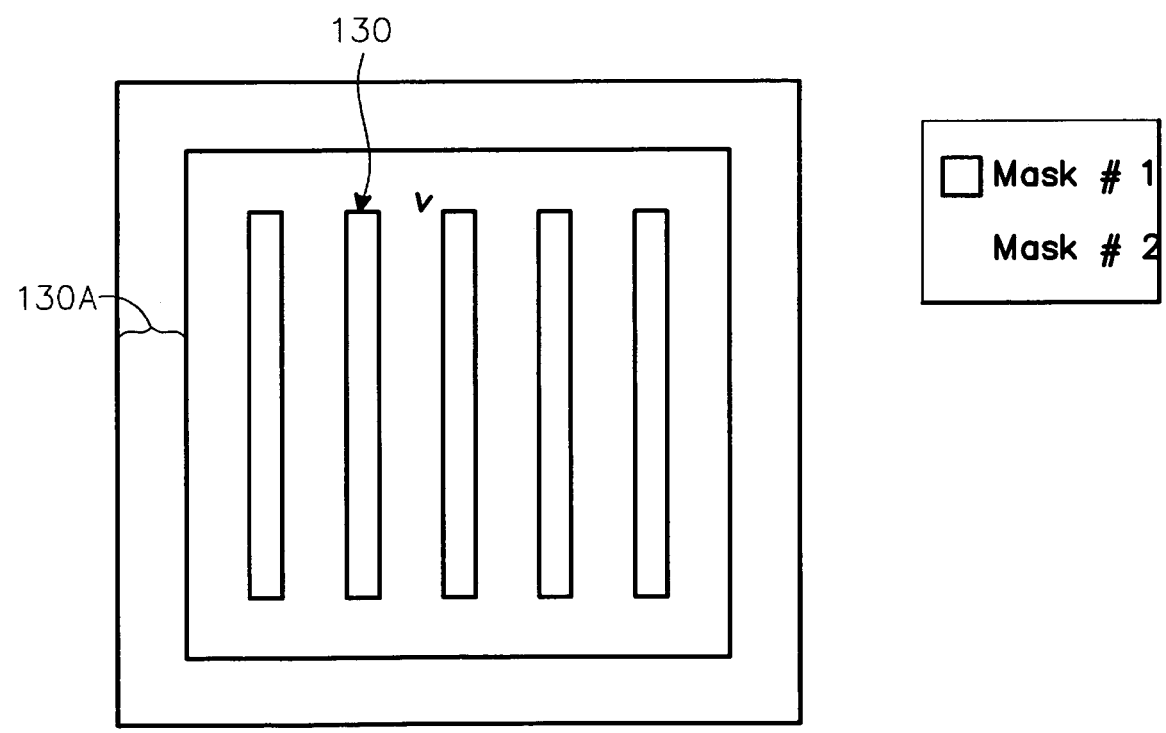

FIG. 12A shows a synoptic layout of the devices in accordance with the present invention. It shows more first trenches 130 formed than forgoing cross-sectional view. Preferably, the size of each first trench 130 in the active region is about 2 µm×2 µm and spaced each other is between 2-20 µm. Other than the first trenches 130 distributed in a form of holes, they can be distributed in a form of long strips, as is shown in FIG. 12B. Typically, the size of each strip is 0.6 µm×20 µm and the spacing (meas width) between two strip is between about 2-20 µm. Thereafter, as is shown in the figure, the total area of the first trench 130 occupied are only a small fraction. More importantly, only two photo masks are required—one is to define the hard mask, the other one is to define the anode.

The benefits of this invention are:
(1) Only two masks are used and thus the manufacturing processes are much simpler than conventional processes.
(2) The LOCOS structure 150 at the bottom of the first trenches 130 and termination trench 130A can enhance the capability of inhibiting breakdown premature when the device is under a reverse biased. More importantly, the LOCOS structure formation in the trench bottom is by means of thin nitride spacer 140 and thus the width of each trench 130 does not demand to be as wide as the conventional devices due to slim effect.
(3) The forward current is almost composed of majority carriers and thus the switching speed performance of the device is superior to those of the conventional devices.
(4) The termination field oxide regions 150A are broad and flatted and thus the bending regions of the depletion boundary are anticipated to be far away from the active region than the conventional device.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method of forming semiconductor device, said method comprising the steps of:
   providing a first conductive type semiconductor substrate having an epi-layer doped with impurities of said first conductive type formed thereon;
   forming a first oxide layer on said epi-layer;
   forming a first nitride layer on said first oxide layer; to define a plurality of first trenches and a termination region;
   forming a second oxide layer on said first nitride layer;
   patterning said second oxide layer and said first nitride layer to define a plurality of first trenches and a termination trench;
   patterning said epi-layer by using said second oxide layer and said first nitride layer as a hard mask;
   thermal growing an oxide layer on said epi-layer portions of said first trenches and said termination trench;
   forming a second nitride layer on said second oxide layer, as well as all of sidewalls and bottoms of said trenches
   performing an anisotropic etching to etch said second nitride layer so as to form a nitride spacer on each of said sidewalls;
   forming a polycrystalline silicon layer on all areas until said first trenches are filled;
   etching back said polycrystalline silicon layer, said first nitride layer using said first oxide layer as a stop layer;
   removing said first oxide layer to expose said epi-layer;
   depositing a Schottky barrier metal layer on said epi-layer and said polycrystalline silicon layer;
   performing an anneal process so as to form silicide layer;
   forming a top metal on entire front surface of said semiconductor substrate; and
   patterning said top metal layer to define an anode;
   removing layers formed on a backside surface of said semiconductor substrate during forgoing steps; and
   forming a backside metal layer on said backside surface, said backside metal layer acted as a cathode electrode.

2. The method according to claim 1 and further comprising a step of performing ion implant to form a first doping layer of said first conductive type beneath said first oxide layer before the step of forming first nitride layer, and further an impurity concentration of said first doping layer higher than that of said epi-layer but lower than that of semiconductor substrate.

3. The method according to claim 1 and further comprising forming a second doping layer beneath bottoms of said first trenches and termination trench before the step of forming polycrystalline silicon layer.

4. The method according to claim 1 wherein said barrier metal layer is made of material selected from the group consisting of Ti, Ni, Cr, Mo, Pt, Zr, Cr, etc., and the combination thereof.

5. The method according to claim 1 wherein said top metal layer is formed of stacked layers of Ti NiAg or Ti W/Al or Al.

6. A power rectifier device, comprising:
   an n− drift layer formed on an n+ substrate;
   a cathode metal layer formed on a surface of said n+ substrate opposite said n-drift layer;
   a plurality of first trenches and a termination trench recessed into said n− drift layer, and said first trenches each separated by a first mesa region and said termination trench spaced from a nearest one of first trenches by a second mesa region;
   said first trenches having an oxide liner and a nitride spacer sequentially formed on sidewalls thereof;
   a field oxide region grown on each bottom of said first trenches and a termination field oxide region grown on a bottom of said termination trench;
   a polycrystalline silicon layer filled in said first trenches and a spacer-like poly gate formed on a sidewall of said termination trench and said termination field oxide region;
   a Schottky barrier silicide layer formed on entire active region and extended to said spacer-like poly gate; and
   an anode metal layer formed continuously on said Schottky barrier silicide layer, and extended to cover a portion of termination field oxide region.

7. The power rectifier device according to claim 6 and further comprising an n doped layer formed beneath said Schottky barrier silicide layer wherein said n doping layer has impurity concentration of said first conductive type higher than that of said n-drift layer but lower than that of said n+ substrate.

8. The power rectifier device according to claim 6 or 7 wherein said Schottky barrier silicide layer is formed of metal silicide selected from the group consisting of silicide of Ti, Ni, Cr, Mo, Pt, Zr, and Cr with Si.

9. The power rectifier device according to claim 6 or 7 wherein said anode metal layer is formed of stacked layers of Ti NiAg or Ti W/Al or Al.

10. The power rectifier device according to claim 6 or 7 and further comprising a p doped region formed beneath said field oxide region.

* * * * *